United States Patent [19]

Ward

[11] Patent Number: 5,166,970
[45] Date of Patent: Nov. 24, 1992

[54] MULTI-CONDUCTOR IDENTIFIER WITH VOICE COMMUNICATION CAPABILITY

[76] Inventor: Timothy K. Ward, 36 Washington Ave., Asheville, N.C. 28804

[21] Appl. No.: 713,129

[22] Filed: Jun. 10, 1991

[51] Int. Cl.[5] .................... H04B 3/26; G01R 31/02
[52] U.S. Cl. ........................... 379/21; 379/25; 379/26; 324/542; 324/556
[58] Field of Search ............ 379/21, 25, 26, 29; 324/539, 540, 541, 542, 556

[56] References Cited

U.S. PATENT DOCUMENTS

| | | |
|---|---|---|
| 1,560,278 | 11/1925 | Mahan . |
| 2,799,739 | 7/1957 | Lowman et al. ............ 379/25 |
| 3,644,687 | 2/1972 | Richards, Jr. ............. 379/25 |
| 3,792,205 | 2/1974 | O'Dea ..................... 379/21 |
| 3,986,106 | 10/1976 | Shuck et al. .............. 379/21 |
| 4,074,187 | 2/1978 | Miller et al. ............. 324/542 |
| 4,388,501 | 6/1983 | Ahuja . |
| 4,524,321 | 6/1985 | Jablway et al. ............ 379/25 |
| 4,536,703 | 8/1985 | Jablway et al. ............ 379/21 |
| 4,575,588 | 3/1986 | Vande Vyver ............. 379/25 |
| 4,588,862 | 5/1986 | Grabowy . |
| 4,596,904 | 6/1986 | Messenger ............... 379/25 |
| 4,777,645 | 10/1988 | Faith et al. .............. 379/31 |
| 4,779,052 | 10/1988 | Levy et al. .............. 324/542 |
| 4,933,962 | 6/1990 | Sanders ................... 379/21 |

OTHER PUBLICATIONS

Douglas R. Connally and Albert L. Pence, "Improved Pair Identification Cuts Cable Handling Costs", *Telephony*, Aug. 9, 1971, pp. 68–72.

Primary Examiner—Stafford D. Schreyer
Attorney, Agent, or Firm—Carter & Schnedler

[57] ABSTRACT

A two-unit device for identifying individual conductors in a multi-conductor installation having two ends. Each unit includes a telephone handset interposed in a series communication and continuity circuit. One of the units is a master unit and includes a multi-position switch for selecting individual conductors. The other unit is a slave unit and includes a set of LEDs. During operation, a person with the master unit selects a particular conductor by means of the switch, and an LED at the slave unit identifies the other end of the selected conductor. The two persons then communicate over the circuit being identified, and establish a label designation for the ends of the particular selected and identified conductor.

13 Claims, 2 Drawing Sheets

MULTI-CONDUCTOR IDENTIFIER WITH VOICE COMMUNICATION CAPABILITY

BACKGROUND OF INVENTION

The present invention relates generally to a device to aid in "ringing out" or identifying individual conductors in a multi-conductor installation having two ends remote from each other. More particularly, the invention relates to such a device which facilitates the identification of individual wires for labeling, and which facilitates communication between two persons located at either end of the multi-conductor installation.

Many multi-conductor installations exist. For example, the multi-conductor installation may comprise a plurality of individual wires pulled through a conduit. Unless the wires are individually and unambiguously color coded, it is necessary to identify each conductor with an identical label at each end, typically, but not necessarily, in numbered sequential order. It will be appreciated that a multi-conductor installation may take a variety of forms. Thus, another example of a multi-conductor installation is a pre-wired cable including a number of conductors.

Normally, identifying individual conductors is a fairly tedious process, even when there is a pre-wired cable. Typical procedures involve the use of simple continuity testers such as ohmmeters, telephone handsets, indicator lights, buzzers, or tone generators and detectors. Communication between the persons of either end of the installation must be provided. Unless the installation ends are within hearing distance, typically a "walkie-talkie" radio or a separate telephone line is employed.

While a variety of specific techniques are employed, in a common procedure the person at one end selects and holds one wire to the test device being employed, and the person at the other end then individually probes each available wire until continuity is found, whereupon the two persons establish the label designation to be applied at each end. A common electrical return path, such as building ground or a green-colored wire is used to establish a complete circuit for testing purposes.

In view of these considerations, a wide variety of devices and solutions have been proposed in the prior art. However, many of these are relatively complex, and lack practical effectiveness in operation.

SUMMARY OF INVENTION

Accordingly, it is an object of invention to provide a device for identifying individual conductors in a multi-conductor installation which is relatively inexpensive, yet efficient in operation, and which promotes speed and accuracy.

It is yet another object of the invention to provide such a device which enables various short and open conditions to be recognized.

It is another object of invention to provide such a device which facilitates communication between persons at either end of the multi-conductor installation over conductors of the actual installation being tested, without requiring a separate radio or other communications link.

Briefly stated, and in accordance with one embodiment of invention, there is provided a device for identifying individual conductors in a multi-conductor installation having two ends, and including a common electrical return path, such as a building ground, or a metal conduit. The device includes a master unit at one end of the multi-conductor installation, and a slave unit at the other end.

The master unit includes a voice transmitting and receiving device, such as an ordinary telephone handset, and the slave unit likewise includes a slave unit voice transmitting and receiving device. The master unit includes a master unit common terminal, such as an alligator clip, adapted for electrical connection to the common electrical return path at the one end of the multi-conductor installation, and the slave unit likewise includes a common terminal adapted for electrical connection to the common electrical return path at the other end of the multi-conductor installation.

The master unit further includes means for selecting an individual conductor at the one end of the multi-conductor installation and establishing said master unit voice transmitting and receiving device in electrical series circuit relationship between the selected conductor and the master unit common terminal to define a master unit series communication and continuity circuit. The slave unit includes at least one slave unit visual indicator, and correspondingly includes means connecting the slave unit voice transmitting and receiving device and the slave unit visual indicator in electrical series circuit relationship between an individual conductor at the other end of the multi-conductor installation and the slave unit common terminal to define a slave unit series communication and continuity circuit. At least one electrical power source is included in at least one of the series communication and continuity circuits. As a result, during operation, persons respectively at the two ends of the multi-conductor installation are able to communicate by means of the voice transmitting and receiving devices regarding electrical continuity between the ends of particular conductors of the multi-conductor installation.

In accordance with a more particular embodiment of the invention, the master unit includes a set of master unit conductor terminals adapted for respective electrical connection to individual conductors at the one end of the multi-conductor installation. The master unit additionally includes a multi-position switch for selectively electrically connecting each of the master unit conductor terminals to a switch circuit node. The master unit voice transmitting and receiving device is connected electrically in series between the switch circuit node and the master unit common terminal to define the master unit series communication and continuity circuit.

The slave unit includes a set of slave unit conductor terminals adapted for respective electrical connection to individual conductors at the other end of the multi-conductor installation. The slave unit additionally includes a set of slave unit visual indicators, such as light emitting diodes (LEDs), corresponding to the salve unit conductor terminals. Each of the slave unit visual indicators is connected electrically between a corresponding slave unit conductor terminal and a slave unit indicator circuit node. The slave unit voice transmitting and receiving device is connected electrically in series between the slave unit indicator circuit node and the slave unit common terminal to define the slave unit series communication and continuity circuit.

During operation and use of the device, at the master unit a particular conductor is selected by means of the multi-position switch, and a particular one of the slave unit visual indicators indicates which particular one of the conductors has been selected by the multi-position switch. At the same time, persons respectively at the two ends of the multi-conductor installation are able to communicate by means of the voice transmitting and receiving devices.

In another more particular embodiment, each position of the multi-position switch has a unique designator, typically a number "1", "2", "3", "4" etc. As a result, during operation, the person with the master unit is able to communicate the person with the slave unit the designation of a particular switch position, and the person with the slave unit is then able to immediately label the particular one of the individual conductors indicated by the particular one of the slave unit visual indicators.

In yet another embodiment, the master unit further includes a set of master unit visual indicators corresponding to the master unit conductor terminals. In this embodiment, an electrical power source, such as a battery, is included in the master unit series communication and continuity circuit. One terminal of the electrical power source is connected to the switch circuit node, and another terminal of the electrical power source is connected to the master unit voice transmitting and receiving device. Each of the master unit visual indicators is then connected electrically between a corresponding master unit conductor terminal and the other terminal of the electrical power source. Thus, a particular one of the master unit visual indicators indicates which particular one of the individual conductors at the master unit end of the multi-conductor cable is connected through the multi-position switch to the switch circuit node.

Each of the master unit visual indicators has a unique designator. As a result, during operation, the person with the master unit is able to communicate to the person with the slave unit the designation of a particular master unit visual indicator, and the person with the slave unit is able to label the particular one of the individual conductors indicated by the particular one of the slave unit visual indicators. The provision of such a set of master unit visual indicator provides a more graphic display which makes it easier to relate the designators to particular conductors, compared to designators on the switch itself.

In addition, the device permits various short and open conditions to be recognized. In the event two conductors are fused or shorted together, then two of the slave unit visual indicators will be activated at once. If a conductor is shorted to ground, then a corresponding slave unit visual indicator will be activated immediately when the device is connected, even before the particular circuit is selected at the master unit. The short-to-ground condition is recognized at the master unit by poor or no communication when the particular conductor is selected. If a conductor is open, then the corresponding slave unit visual indicator will not be activated, and there will be no communication.

It will be appreciated that the provision of a set of master unit visual indicators as described above affords the potential for "sneak" current paths to exist. Accordingly, the device further includes means for preventing such "sneak" current paths from activating more than one of the master unit visual indicators at a time, and more than one of the slave unit visual indicators at a time. Preferably, the means for preventing sneak current paths comprises the electrical power source being a DC power source, and the visual indicators being light emitting diodes which conduct current in one direction only.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DETAILED DESCRIPTION

Figure 1:
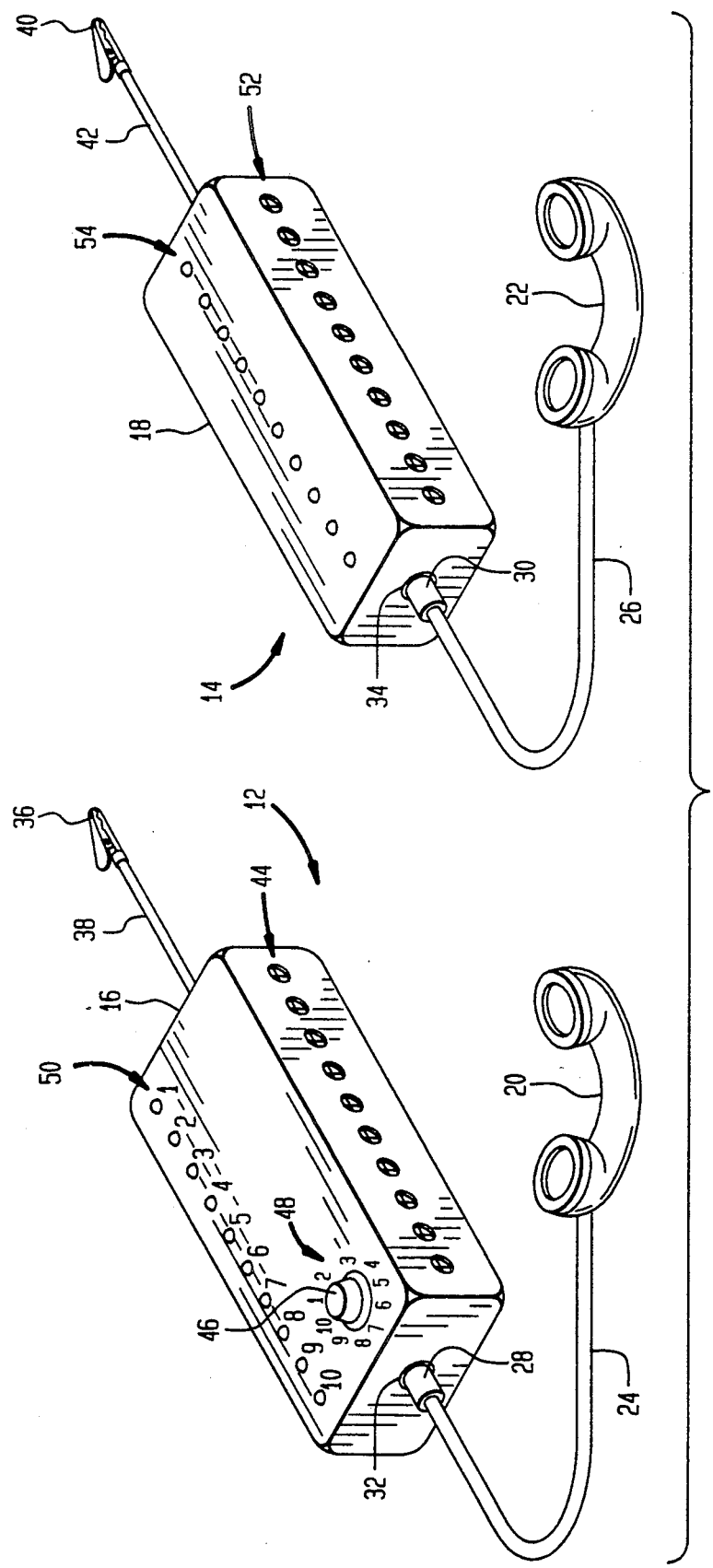
FIG. 1 depicts the appearance of one form of a pair of units in accordance with the invention.

Referring first to FIG. 1, a device 10 in accordance with the invention comprises a master unit, generally designated 12, and a slave unit, generally designated 14, to be used at opposite ends of a multi-conductor installation having a plurality of individual conductors, and a common electrical return path, such as a conduit wall, a building ground, or a color-code wired (e.g. a green wire). The two units 12 and 14 respectively include a master unit housing 16 and a slave unit housing 18. Located externally of the housings 16 and 18 are respectively a master unit voice transmitting and receiving device 20, in the exemplary form of a telephone handset, and a slave unit voice transmitting and receiving device 22, likewise in the exemplary form of a telephone handset. The telephone handsets 20 and 22 have respective cords 24 and 26 with respective connectors 28 and 30 which mate with respective jacks 32 and 34 on the housings 16 and 18.

The master unit 12 includes a master unit common terminal 36 adapted for electrical connection to the common electrical return path at one end of the multi-conductor installation. Preferably, the master unit common terminal 36 comprises an allegator clip connected to a flexible lead 38 extending from the housing 16.

Similarly, the slave unit 14 includes a slave unit common terminal 40, also in the form of an alligator clip connected to a flexible lead 42 extending from the housing 18.

The master unit 12 includes a set of master unit conductor terminals, collectively designated 44, adapted for respective electrical connection to individual conductors at one end of the multi-conductor installation. The terminals 44 may comprise any convenient form of terminal. Examples include screw terminals, or even individual leads with alligator clips. Preferably, however, the terminals 44 are "quick connect" terminals which do not require tools to operate, such as are commonly employed as speaker jacks in audio equipment.

The master unit conductor terminals 44 are designated such as by numbers "1" through "10". Although ten terminals 44 are illustrated, it will be appreciated that a great many more may be employed, such as a total of forty, or even more.

The master unit 12 additionally includes a multi-position switch 46 for individually selecting the master unit conductor terminals 44, in a manner described hereinbelow with reference to FIG. 2. For indicating the particular master unit conductor terminal 44 selected, either the master unit 46 may be provided with numbered switch positions, collectively designated 48, or a series of numbered master unit visual indicators, collectively designated 50, may be provided. While the switch 46 is shown as a rotary switch, it will be appreciated that other forms of switch may be employed, such as a slide switch. In the case of a slide switch, individual switch positions preferably correspond physically with individual terminal 44 positions.

The FIG. 1 slave unit 14 similarly includes a set of slave unit conductor terminals, collectively designated 52, adapted for respective electrical connection to individual conductors at the other end of the multi-conductor installation. Also included is a set of slave unit visual indicators, collectively designated 54, corresponding to the slave unit conductor terminals 52.

Advantageously there is a visually clear and unambiguous physical correspondence between individual designated master unit visual indicators 50 and individual master unit conductor terminals 44 to facilitate rapid and unambiguous recognition of the particular designation for each of the terminals 44 and the connected conductor of the multi-conductor installation. Likewise there is a visually clear and unambiguous physical correspondence between individual slave unit visual indicators 54 and individual slave unit conductor terminals 52.

While it is significant that correspondence is maintained between the slave unit conductor terminals 52 and the slave unit visual indicators 54, neither the slave unit conductor terminals 52 nor the slave unit visual indicators 54 are necessarily numbered.

In the overall operation of the multi-conductor identifier device 10 as thus far described, persons at either end of the multi-conductor cable installation connect individual conductors of the installation to the conductor terminals 44 and 52. In addition, the common terminals 36 and 40 are clipped to a common electrical return path, such as a building ground, the conduit itself (in cases where the multi-conductor installation comprises individual wires pulled through a cable) or a color-coded wire such as a green-colored wire that may be included in the installation.

At this point, the person with the master unit 12 selects, for example, switch position "1", as indicated either by one of the designators 48 associated with the multi-position switch 46 or a designator associated with one of the visual indicators of the set 50.

It will be appreciated that the correspondence between the terminal connections 44 at the master unit 12 and the terminal connections 52 at the slave unit 14 is essentially random because the individual conductors of the installation have not yet been identified.

In any event, one of the visual indicators of the set 54 at the slave unit 14 illuminates, and the persons at the two ends of the multi-conductor installation are in voice communication via the two handsets 20 and 22. As just noted, it will be appreciated that the particular one of the visual indicators 54 which illuminates is a random selection. The person with the master unit 12 states, for example, that he has selected conductor number "1". The person with the slave unit 14 observes which particular indicator of the set 54 is illuminated. Both persons then label the ends of the selected and identified conductor with the agreed-upon designator.

The procedure then continues, with the person with the master unit 12 then selecting switch position "2", for example, and communicating that fact to the person with the slave unit 14, and both persons label the selected and identified conductor with numeral designator "2", for example.

The process rapidly and efficiently continues, until the person with the master unit 12 has gone through a number of switch positions corresponding with the total number of conductors in the multi-conductor installation. At this point, each end of each conductor is identically labeled.

It will be appreciated that, so long as the person with the master unit 12 selects a switch position corresponding to a conductor that is actually present, an effective voice communication path is established.

In addition, as noted above, the device 10 permits various short and open conditions to be recognized. In the event two conductors of the installation 60 are fused or shorted together, then two of the slave unit visual indicators 54 will be activated at once. If a conductor is shorted to ground, then a corresponding slave unit visual indicator 54 will be activated immediately when the device 10 is connected, even before the particular circuit is selected at the master unit. The short-to-ground condition is recognized at the master unit 12 by poor or no communication when the particular conductor is selected. If a conductor is open, then the corresponding slave unit visual indicator 54 will not be activated, and there will be no communication.

Figure 2:
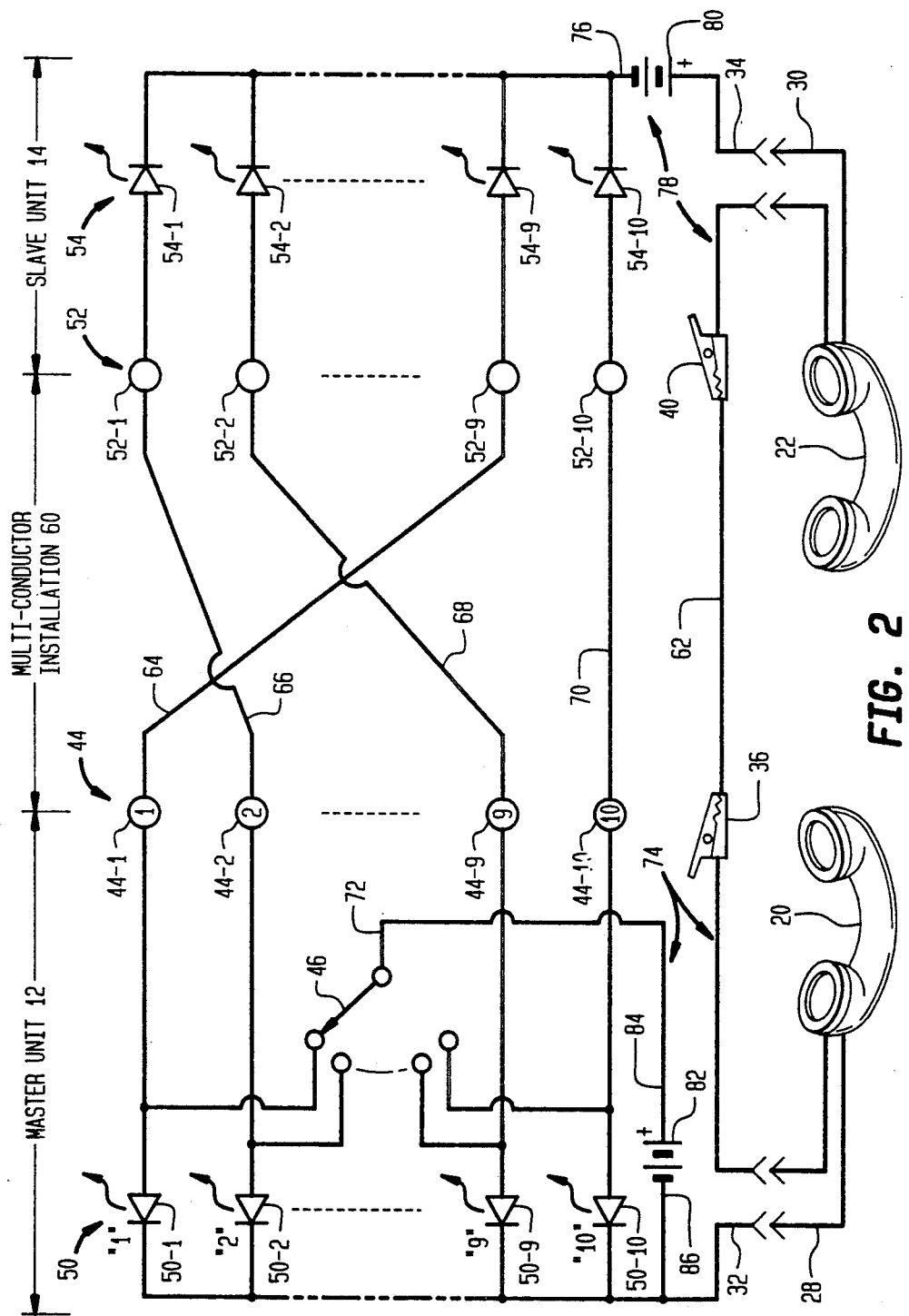
FIG. 2 is an electrical schematic diagram of the device of FIG. 1.

Referring now to FIG. 2, shown in electrical schematic diagram form are the master 12 and slave 14 units, as well as a representative multi-conductor installation 60. In FIG. 2, identical reference numerals are employed for corresponding elements of FIG. 1. In FIG 2, individual terminals of the set 54 of master unit conductor terminals are designated 44-1, 44-2 and so on through 44-9 and 44-10. (Intermediate terminals of the set 44 are omitted from the illustration.) Again, it will be appreciated that the total number ten is exemplary only, and any desired number of conductor terminals 44 may be employed.

Individual terminals of the set 52 of slave unit conductor terminals are similarly designated 52-1, 52-2 and so on through 52-9 and 52-10. The numbered master unit visual indicators of the set 50 are designated 50-1, 50-2 and so on through 50-9 and 50-10, and the slave unit visual indicators of the set 54 are designated 54-1, 54-2 and so on through 54-9 and 54-10.

In FIG. 2, the master unit common terminal 36 is shown connected to a common electrical return path 62 at one end of the multi-conductor installation, and the slave unit common terminal 40 is connected to the common electrical return path 62 at the other end. As noted hereinabove, the common electrical return path 62 may comprise, for example, a building ground, a metal conduit, or a designated color-coded conductor, such as a green conductor commonly employed to designated "ground".

Similarly, the master unit conductor terminals 44 are connected to representative individual conductors 64, 66, 68 and 70 of the multi-conductor installation 60. It will be appreciated that the connection of particular terminals of the set 44 to particular ones of the representative conductors 64, 66, 68 and 70 is arbitrary and random, as typically the conductors of the multi-conductor installation 60 have no particular identity prior to being identified and labeled with the aid of the device 10 of the invention.

At the other end of the multi-conductor installation 60, the representative individual conductors 64, 66, 68 and 70 are connected to the slave unit conductor terminals 52, but in a random order in the absence of designations on the individual conductors. Thus, for example, conductor 64 extends between master unit terminal 44-1 and slave unit terminal 52-9. Conductor 66 extends between master unit terminal 44-2 and slave unit terminal 52-1. Conductor 68 extends between master unit terminal 44-9 and slave unit terminal 52-2. By coincidence only in this particular example, conductor 70 extends between master unit terminal 44-10 and slave unit terminal 52-10.

Associated with the multi-position switch 46 in the master unit 12 is a switch circuit node 72, and the multi-position switch 46 serves to selectively electrically connect each of the master unit conductor terminals 44-1, 44-2 and so on through 44-9 and 44-10 to the switch circuit node 72. The master unit voice transmitting and receiving device in the form of a representative telephone handset 20, is connected electrically in series between the switch circuit node 72 and the master unit common terminal 36, to define a master unit series communication and continuity circuit 74.

In the slave unit 14, the set 54 slave unit visual indicators which correspond to the slave unit conductor terminals 52 preferably comprise light emitting diodes (LEDs) and are each connected electrically between a corresponding one of the slave unit conductor terminals 52 and a slave unit indicator circuit node 76. The slave unit voice transmitting and receiving device, in the representative form of a telephone handset 22, is connected electrically in series between the slave unit indicator circuit node 76 and the slave unit common terminal 40, to define a slave unit series communication and continuity circuit 78.

The wiring of the telephone handsets 20 and 22 is not critical. It will be appreciated that each of these handsets 20 and 22 includes separate transmitter and receiver elements. The transmitter and receiver elements of each of the handsets 20 and 22 may be wired either in series or in parallel as desired. A parallel connection is presently preferred. Instead of telephone handsets 20 and 22, other forms of voice transmitting and receiving devices may be employed, such as combination headsets and boom microphones for hands-free operation. The voice transmitting and receiving devices 20 and 22 may include appropriate networks consisted with the particular transmitter and receiver elements employed.

At least one electrical power source is included in at least one of the series communication and continuity circuits 74 and 78. As one example, a nine-volt DC battery 80 is included in the series communication and continuity circuit 78 of the slave unit 14. It will be appreciated that, with the battery 80 in the circuit, and with a direct electrical connection between the master unit handset 20 and the switch circuit node 72, a continuous talking path is established, and one of the slave unit visual indicators 54 illuminates. In the particular switch position shown in FIG. 2, which may be designated position "1", master unit conductor terminal 44-1 is active, and current flows through the conductor 64 to slave unit conductor terminal 52-9 to activate light emitting diode 54-9. At this point, both ends of the conductor 64 are clearly identified, and the persons at either end of the multi-conductor installation, by means of the provided voice communication, can agree to label the ends of the conductor 64 with number "1", and then proceed on to subsequent switch 46 positions, in accordance with the operation described in greater detail hereinabove.

Preferably the set 50 of master unit visual indicators is also provided, corresponding to individual terminals of the set 44. Again, these may comprise light emitting diodes (LEDs). To power these visual indicators 50 in the particular circuit configuration depicted, a second battery 82, preferably also a nine volt DC battery, is included in the series communication and continuity circuit 74 of the master unit 12. Specifically, one terminal (+) 84 of the battery 82 is connected to the switch circuit node 72, and the other terminal (−) 86 of the battery 82 is connected to the master unit handset 20 through the jack 32 and connector 28.

Each of the master unit visual indicators 50-1, 50-2 and continuing through 50-9 and 50-10 is connected electrically between a corresponding master unit conductor terminal 44 and the other (−) terminal 86 of the battery 82. As a result, a particular one of the master unit visual indicators 50 indicates which particular one of the individual conductors 64, 66, 68 and 70 is selected and thus connected through the multi-position switch 46 to the switch circuit node 72.

It will be appreciated that the circuit of FIG. 2 has the potential of establishing "sneak" current paths whereby more than one of the master unit visual indicators 50 or more than one of the slave unit visual indicators 54 might be activated at a time. For example, in the particular switch position depicted in FIG. 2, one potential "sneak" current path which exists starts with the (+) terminal 84 of the battery 82, and proceeds through the switch 46, the terminal 44-1, the conductor 64, the terminal 52-9, the indicator 54-9, the indicator 54-10, the terminal 52-10, the conductor 70, the terminal 44-10, the indicator 50-10, and back to the (−) terminal 86 of the battery 82. Thus, if this particular "sneak" current path were allowed to exist, the indicators 50-1 and 50-2 would both be activated, rendering the device 10 useless. However, such "sneak" current paths are prevented by the use of DC power sources, and unidirectional conduction devices in the circuit. While incandescent light bulbs might be employed as a visual indicators, with series diodes (LEDs), advantageously light-emitting diodes are employed throughout as the visual indicators, LEDs inherently conduct current in one direction only. Accordingly, all possible "sneak" current paths are blocked. In the particular example of a potential "sneak" current path just described, the current path in fact does not exist because the slave unit LED 54-10 is reverse biased, and so does not conduct.

A number of so-called "sneak" current paths would exist in the absence of means to prevent them, not just the one example just described.

Although not specifically illustrated, the master unit LEDs 50 could be connected in the circuit between the multi-position switch 46 and the terminals 44, directly in series with the slave unit LEDs 54. In this particular circuit configuration, an individual one of the master unit LEDs 54 would indicate that a continuity and a talking path had in fact been established, and additionally would indicated at the master unit 12 a possible short circuit condition when more than one LED illuminates.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A device for identifying individual conductors in a multi-conductor installation having two ends and including a common electrical return path, said device comprising:

a master unit including
- a master unit voice transmitting and receiving device,
- a master unit common terminal adapted for electrical connection to the common electrical return path at one end of the multi-conductor installation,
- means for selecting an individual conductor at the one end of the multi-conductor installation and establishing said master unit voice transmitting and receiving device in electrical series circuit relationship between said selected conductor and said master unit common terminal to define a master unit series communication and continuity circuit;

a slave unit including
- a slave unit voice transmitting and receiving device,
- a slave unit common terminal adopted for electrical connection to the common electrical return path at the other end of the multi-conductor installation,
- at least one slave unit visual indicator,
- means for connecting said slave unit voice transmitting and receiving device and said at least one slave unit visual indicator in electrical series circuit relationship between an individual conductor at the other end of the multi-conductor installation and said slave unit common terminal to define a slave unit series communication and continuity circuit; and at least one electrical power source included in at least one of said series communication and continuity circuits;

whereby, during operation, persons respectively at the two ends of the multi-conductor installation are able to communicate by means of said voice transmitting and receiving devices regarding electrical continuity between the ends of particular conductors of the multi-conductor installation.

2. A device in accordance with claim 1, wherein each of said voice transmitting and receiving devices comprises a telephone handset.

3. A device for identifying individual conductors in a multi-conductor installation having two ends and including a common electrical return path, said device comprising:

a master unit including
- a set of master unit conductor terminals adapted for respective electrical connection to individual conductors at one end of the multi-conductor installation;
- a master unit common terminal adapted for electrical connection to the common electrical return path at the one end of the multi-conductor installation,
- a switch circuit node,
- a multi-position switch for selectively electrically connecting each of said master unit conductor terminals to said switch circuit node, and
- a master unit voice transmitting and receiving device connected electrically in series between said switch circuit node and said master unit common terminal to define a master unit series communication and continuity circuit;

a slave unit including
- a set of slave unit conductor terminals adapted for respective electrical connection to individual conductors at the other end of the multi-conductor installation,
- a slave unit common terminal adapted for electrical connection to the common electrical return path at the other end of the multi-conductor installation.
- a slave unit indicator circuit node,
- a set of slave unit visual indicators corresponding to said slave unit conductor terminals, each of said slave unit visual indicators connected electrically between a corresponding slave unit conductor terminal and said slave unit indicator circuit node, and
- a slave unit voice transmitting and receiving device connected electrically in series between said slave unit indicator circuit node and said slave unit common terminal to define a slave unit series communication and continuity circuit; and at least one electrical power source included in at least one of said series communication and continuity circuits;

whereby, during operation, a particular one of said slave unit visual indicators indicates which particular one of the individual conductors at the other end of the multi-conductor installation corresponds to a particular one of the individual conductors at the one end of the multi-conductor installation selected by said multi-position switch, and persons respectively at the two ends of the multi-conductor installation are able to communicate by means of said voice transmitting and receiving devices.

4. A device in accordance with claim 3, wherein individual ones of said set of slave unit visual indicators correspond physically with individual ones of said set of slave unit conductor terminals.

5. A device in accordance with claim 3, wherein each of said voice transmitting and receiving devices comprises a telephone handset.

6. A device in accordance with claim 3, wherein said slave unit visual indicators comprise light emitting diodes.

7. A device in accordance with claim 3, wherein each position of said multi-position switch has a unique designator, whereby, during operation, the person at the one end of the multi-conductor installation is able to communicate to the person at the other end of the multi-conductor installation the designator of a particular switch position, and the person at the other end of the multi-conductor installation is able to label the particular one of the individual conductors indicated by the particular one of the slave unit visual indicators.

8. A device in accordance with claim 3, wherein:
said master unit includes
- a master unit housing supporting said multi-position switch,
- a master unit communication jack for said master unit voice transmitting and receiving device supported by said master unit housing, and
- said master unit voice transmitting and receiving device having a cord with a connector mating with said master unit communication jack; and wherein said slave unit includes
- a slave unit housing supporting said set of slave unit visual indicators,
- a slave unit communication jack for said slave unit voice transmitting and receiving device supported by said slave unit housing, and
- said slave unit voice transmitting and receiving device having a cord with a connector mating with said slave unit communication jack.

9. A device in accordance with claim 8, wherein each of said voice transmitting and receiving devices comprises a telephone handset.

10. A device in accordance with claim 3, wherein said master unit further includes:
- an electrical power source in said master unit series communication and continuity circuit, one terminal of said electrical power source being connected to said switch circuit node, and another terminal of said electrical power source being connected to said master unit voice transmitting and receiving device;
- a set of master unit visual indicators corresponding to said master unit conductor terminals, each of said master unit visual indicators connected electrically between a corresponding master unit conductor terminal and said another terminal of said electrical power source such that a particular one of said master unit visual indicators indicates which particular one of the individual conductors at the one end of the multi-conductor cable is connected through said multi-position switch to said switch circuit node; and
- means for preventing sneak current paths from activating more than one of said master unit visual indicators at a time, and more than one of said slave unit visual indicators at a time.

11. A device in accordance with claim 10, wherein said means for preventing sneak current paths comprises said electrical power source being a DC power source, and said visual indicators being light emitting diodes which conduct current in one direction only.

12. A device in accordance with claim 10, wherein each of said master unit visual indicators has a unique designator,
whereby, during operation, the person at the one end of the multi-conductor installation is able to communicate to the person at the other end of the multi-conductor installation the designator of a particular master unit visual indicator, and the person at the other end of the multi-conductor installation is able to label the particular one of the individual conductors indicated by the particular one of the slave unit visual indicators.

13. A device in accordance with claim 10, wherein individual ones of said set of master unit visual indicators correspond physically with individual ones of said set of master unit conductor terminals.

* * * * *